United States Patent [19]
Hirata

[11] Patent Number: 5,508,890
[45] Date of Patent: Apr. 16, 1996

[54] FRAME UNIT OF ELECTRICAL APPARATUS AND ELECTRICAL APPARATUS HAVING THE FRAME UNIT

[75] Inventor: Akihiko Hirata, Fukuoka, Japan

[73] Assignee: Matsushita Electric Industrial Co., Ltd., Kadoma, Japan

[21] Appl. No.: 327,685

[22] Filed: Oct. 24, 1994

[30] Foreign Application Priority Data

Oct. 26, 1993 [JP] Japan ................... 5-267607

[51] Int. Cl.⁶ .................................. H05K 7/14
[52] U.S. Cl. .............. 361/829; 312/223.1; 361/690; 361/796
[58] Field of Search .............. 312/223.1, 348.3; 439/64, 61, 377; 165/80.3, 122, 126; 454/184; 248/223.4; 361/690, 692, 693, 717–721, 784, 788, 796, 829, 831; 211/41

[56] References Cited

U.S. PATENT DOCUMENTS

| | | | |
|---|---|---|---|
| 4,116,510 | 9/1978 | Franco | 312/257 SK |
| 4,501,368 | 2/1985 | Gill | 211/41 |
| 4,886,576 | 9/1989 | Umetsu | 361/429 |
| 5,227,957 | 7/1993 | Deters | 361/395 |

FOREIGN PATENT DOCUMENTS

| | | |
|---|---|---|
| 3145797 | 6/1991 | Japan . |
| 3214795 | 9/1991 | Japan . |
| 5160585 | 6/1993 | Japan . |

*Primary Examiner*—Gerald P. Tolin
*Attorney, Agent, or Firm*—Cushman, Darby & Cushman

[57] ABSTRACT

A top board and a bottom board as the substrate support members of a frame unit have a front lip and a rear lip having locating members, which are formed to protrude to right and left sides from both ends of front and rear lips. When the frame unit is assembled, the locating members are fixed to front and rear lips of side boards by means of first securing parts and second securing parts, which are enlarged to tighten the locating members and the side boards when these securing parts are pushed into the fitted holes in the side boards and the locating members.

12 Claims, 15 Drawing Sheets

5,508,890

FRAME UNIT OF ELECTRICAL APPARATUS AND ELECTRICAL APPARATUS HAVING THE FRAME UNIT

FIELD OF THE INVENTION AND RELATED ART STATEMENT

1. Field of the Invention

The present invention relates to a frame unit for a an electrical apparatus and an electrical apparatus having the frame unit.

2. Description of the Related Art

In recent years, a frame unit, which can be configured or put together accurately without a special tool, has been required for assembling an electrical apparatus. The frame unit has been constructed so as to be connected to other frame units having the same construction in order to expand the functions of the electrical apparatus. Demand for such frame units to be connected for expanding the functions are steadily increasing. Therefore, it has been required that such frame units can be easily and speedily connected to the other frame units.

Hereafter, a conventional frame unit is explained with reference to FIG. 13 to FIG. 17.

FIG. 13 is a perspective view of a conventional frame unit 50. FIG. 14 is an exploded perspective view of the frame unit 50 of FIG. 13. In FIGS. 13 and 14, the conventional frame unit 50 comprises a pair of substrate support members 42A, 42B disposed at the top part and the bottom part, a pair of side boards 46A, 46B disposed at both sides and an air guide board 51 disposed on the upper substrate support member 42A. The substrate support members 42A, 42B are composed of a top board 42A and a bottom board 42B, which are formed to have the same shape and sizes and arranged substantially parallel facing with each other. The top board 42A and the bottom board 42B have front and rear lips 43 and side lips 44 that contact side boards 46A, 46B. Plural substrate guide ribs 45 are provided in the top board 42A and the bottom board 42B for supporting and guiding substrates having electrical devices (not shown). The substrate guide ribs 45 are formed by bending cut-plates in a flat portion of the top board 42A and the bottom board 42B. The substrate guide ribs 45 (FIG. 14) of the top board 42A are formed so as to face the substrate guide ribs 45 of the bottom board 42B.

Each of the side boards 46A, 46B have top and bottom lips 47A, 47B, front and rear lips 48A, 48B, and a flat portion 49 surrounded by the top, bottom, front and rear lips 47A, 47B, 48A, 48B. The side boards 46A, 46B are firmly connected to the top board 42A and the bottom board 42B by screwing bolts B. The above-mentioned two side boards 46A, 46B are constructed to have the same shape and sizes, and are arranged so as to face each other.

The air guide board 51 has two support portions 51A, 51B, which are formed by bending both sides of the air guide board 51. The air guide board 51 is disposed on the flat portion 52 of the top board 42A so as to raise the rear side (right hand edge) of the air guide board 51. The air guide board 51 is fixed to the flat portion 52 of the top board 42A bolts B, which are screwed into connecting holes 58 in the top board 42A through connecting holes 57 formed in the support portions 51A, 51B of the air guide board 51.

In FIG. 14, outstandly projecting protrusions 53 are provided on the side lips 44 of the top board 42A and the bottom board 42B. Two connecting holes 54 to receive bolts B are provided on the side lip 44 across the two protrusions 53, as shown in FIG. 14.

Plural locating holes 55 are formed on the flat portions 49 of the side boards 46A, 46B so as to receive the protrusions 53 of the top board 42A and bottom board 42B. Plural connecting holes 56 are formed on the flat portions 49 of the side boards 46A, 46B so as to receive the bolts B. The bolts B are screwed into the connecting holes 54 of the top board 42A or the bottom board 42B through the connecting holes 56 of the side boards 46A, 46B. In this manner, the side boards 42A, 42B are fixed to the top board 42A and the bottom board 42B.

Plural substrates (not shown) having electrical devices are supported by the substrate guide ribs 45 of the top board 42A and the bottom board 42B. Air heated by the electrical devices etc. in the frame unit 50 flows up toward the air guide board 51 through plural air holes 59 of the flat portion 52 of the top board 42A. The hot air is discharged to the rear side of the frame unit 50 by the air guide board 51, which is not provided for improving mechanical strength of the frame unit 50.

FIG. 15 is an exploded perspective view showing the connection of two conventional frame units 50.

In FIG. 15, downward protrusions 60 are provided on a lower face of the bottom lip 47B. The downward protrusions 60 are pushed into locating holes 62 of the top lip 47A for accurately positioning the two frame units 50. Two connecting holes 61 are formed in the bottom lip 47B of the side boards 46A, 46B to receive connecting bolts 64. As shown in FIG. 15, the connecting bolts 64 are screwed into connecting holes 63 of the top lips 47A of the lower frame unit 50 through the connecting holes 61 of the bottom lips 47B of the upper frame unit 50.

In the connecting steps, when the upper frame unit 50 is put on the lower frame unit 50 as shown in FIG. 15, the downward protrusions 60 of the upper frame 50 engage to the locating holes 62 of the lower frame unit 50, and the bottom lips 47B of the upper frame unit 50 are fixed to the top lips 47A of the lower frame unit 50 by screwing the connecting bolts 64. In this connecting step, the connecting bolts 64 are screwed by a tool (e.g. a screwdriver) which is handled downwardly beside the side board 46A, 46B of the upper frame unit 50. Therefore, the top and bottom lips 47A, 47B are formed to have a wide width, and the connecting holes 61 and 63 are arranged to be apart from the flat portions 49 of the side boards 46A, 46B in order to easily handle the tool without the tool or user's hand striking the flat portions 49 of the slid boards 46A, 46B.

FIG. 16 is a perspective view of the frame units 50 connected by the connecting bolts 64. FIG. 17 is a sectional view of a bed 65 which is used in the assembling step for the conventional frame unit 50.

In FIG. 17, the bed 65 is provided exclusively for assembling the conventional frame unit 50.

In a first assembly step, the bottom board 42B is placed on a center portion 65A of the bed 65, and the side boards 46A, 46B are placed on step portions 65B. Next, the bottom board 42B is connected provisionally to side boards 46A, 46B by screwing the bolts B. In a second step, the top board 42A is arranged between the side boards 46A and 46B, and connected by screwing the bolts B to the side boards 46A, 46B along with adjusting operations for keeping a right angle between the side boards 46A, 46B and the top and bottom boards 42A, 42B.

In the above-mentioned assembling steps, in almost all of the conventional frame unit 50, the substrate support means 42A, 42B and the side boards 46A, 46B are assembled by using only one locating means such that the protrusions 53 of the substrate support means 42A, 42B are pushed into the locating holes 55 of the side boards 46A, 46B. Therefore, in the assembling step, the protrusions 53 are apt to come off of the locating holes 55 of the side board 46A when the other protrusions 53 are pushed into the other locating holes 55 of the side board 46B.

The protrusions 53 and the locating holes 55 of the conventional frame unit 50 must be formed precisely at predetermined positions so as to assemble accurately the frame unit 50. If the protrusions 53 or the locating holes 55 are formed in an inaccurate shape or at different positions, the substrate support means 42A, 42B are not positioned accurately and tilt to one side. Therefore, it is very difficult to manufacture a lot of frame units 50 having a predetermined proper shape.

For this reason, in the assembling steps for the conventional frame unit 50, it was necessary to use an exclusive tool for preventing the lean of the side boards 46A, 46B as shown in FIG. 17. In the assembling steps for mass-producing the frame unit, it is necessary to provide a lot of exclusive tools corresponding to the quantity of the mass-production, and to have a step for setting up the exclusive tool.

In the connecting steps for vertically connecting two conventional frame units, the bottom lip of the upper frame unit is put on the top lip of the lower frame unit, and connected by handling a screwdriver or the like downwardly beside the side boards. In some conventional frame unit (not shown) large holes are provided in the side board for enabling easy handling of the screwdriver etc. without contact between the side board and the screwdriver etc. Another conventional frame unit (not shown) provides a special tool for connecting the top lips of the lower frame unit and the bottom lips of the upper frame unit.

In the aforementioned conventional frame unit 50 shown in FIGS. 13 to 16, the top and bottom lips 47A, 47B are formed to have a wide width for enabling easy handling of the screwdriver etc. without contact between the flat portion 49 of the side board 46A, 46B and the tool for screwing bolts or the user's hands. In some conventional frame units, wiring cables are arranged to pass along the outer periphery of the side board 46A or 46B. In this case, it is difficult to arrange the wiring cables along the side board 46A or 46B because the top and bottom lips 47A, 47B are formed to protrude outwardly.

In the connecting steps for vertically connecting two of the above-mentioned frame units, there is a problem in that a lower frame unit is twisted owing to the weight of an upper frame unit and/or substrates having electrical devices in the upper frame unit. Further, if the frame unit connected with insufficient mechanical strength receives external forces, it may be twisted, and substrates etc. disposed in the frame unit may be broken as a result.

OBJECT AND SUMMARY OF THE INVENTION

The present invention provides a frame unit which solves the above-mentioned problems.

In order to achieve the above-mentioned object, a frame unit for an electrical apparatus in accordance with the present invention comprises:

a pair of substrate support members, each of which has bent collars on a front edge, a rear edge and both sides edges and has plural locating members each having engaging holes and cuttings at both end portions of the bent collars, a pair of side boards, each of which has bent collars on a top edge, a bottom edge, a front edge and a rear edge and has plural cut-out at bent collars of the front edge and the rear edge for engagement with the cuttings, and securing means for connecting the substrate support members and the side boards.

In another aspect, an electrical apparatus having a frame unit in accordance with the present invention comprises:

a pair of substrate support members, each of which has bent collars on a front edge, a rear edge and both side edges and has plural locating members each having engaging holes and cuttings at both end portions of the bent collars, a pair of side boards, each of which has bent collars on a top edge, a bottom edge, a front edge and a rear edge and has plural cut-out at bent collars of the front edge and the rear edge for engagement with the cuttings, and securing means for connecting the substrate support members and the side boards.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of a Figures are schematic representations for purposes of illustration and do not necessarily depict the actual relative sizes or locations of the elements shown.

DESCRIPTION OF THE PREFERRED EMBODIMENTS

Hereafter, the preferred embodiment of the present invention will be described with reference to FIG. 1 through FIG. 12.

Figure 1:
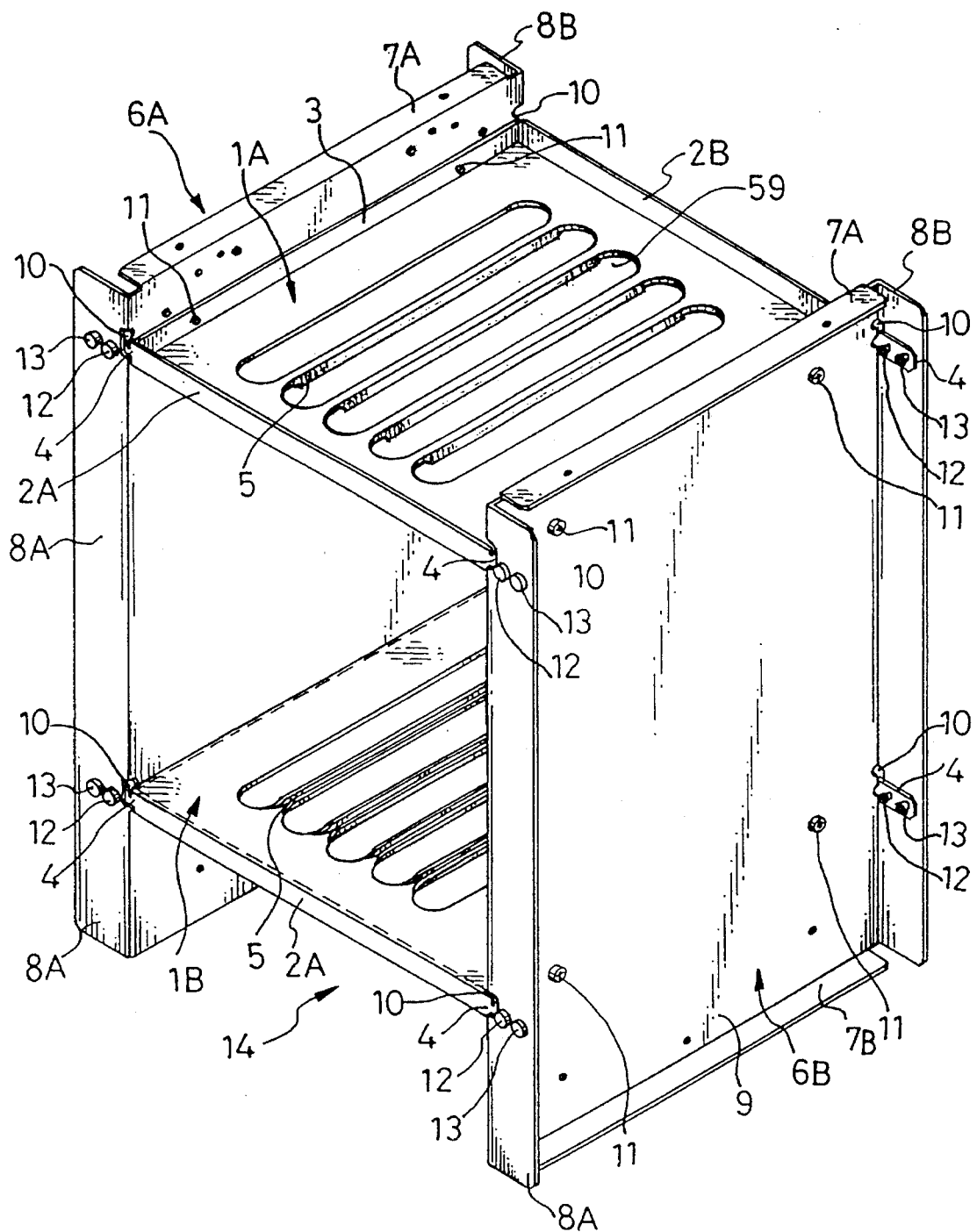
FIG. 1 is a perspective view showing a frame unit for an electrical apparatus in accordance with the present invention.
Figure 2:
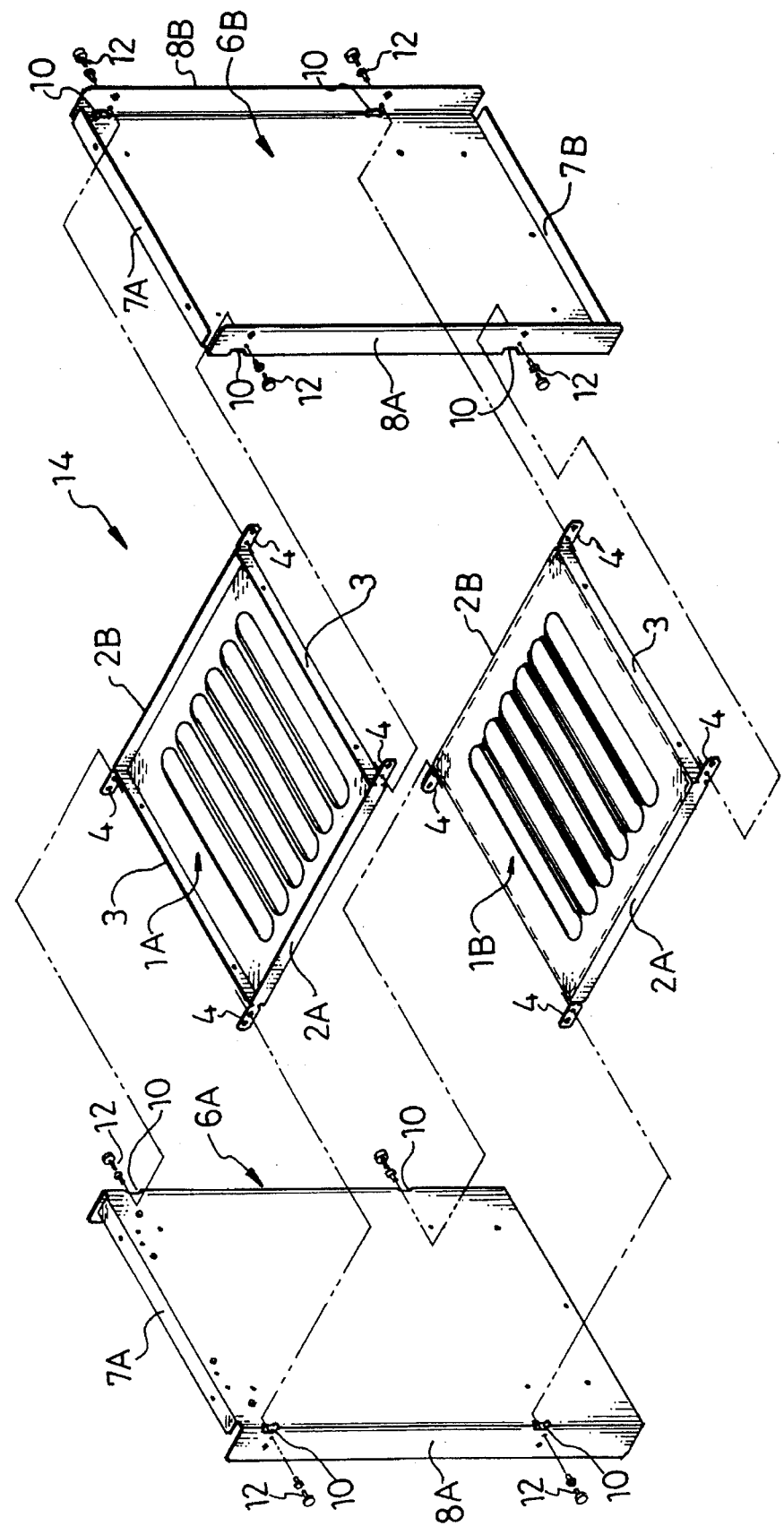
FIG. 2 is an exploded perspective view showing the frame unit of FIG. 1.

FIG. 1 shows a perspective view of a frame unit 14 for receiving plural electrical apparatus, such as substrates having electrical devices. FIG. 2 shows an exploded perspective view of the frame unit 14.

In FIGS. 1 and 2, the frame unit 14, which is made of metal such as steel or aluminum, comprises a pair of top and bottom boards 1A, 1B as substrate support members and a pair of side boards 6A, 6B. The top board 1A and the bottom board 1B are formed to have the same shape and sizes and are arranged substantially parallel with each other. The top board 1A and the bottom board 1B have front and rear lips 2A, 2B, and side lips 3. Side lips 3 contact the side boards 6A, 6B. As shown in FIG. 2, locating members 4 are formed on both ends of the front and rear lips 2A, 2B. The top board 1A and the bottom board 1B have substrate guide ribs 5 which are formed by bending cut-plates on facing surfaces of the top board 1A and the bottom board 1B. The substrate guide ribs 5 are provided for guiding and supporting the substrates (not shown) having electrical devices etc. The side board 6B on a right side has a top lip 7A, a bottom lip 7B, a front lip 8A, a rear lip 8B and a flat portion 9 surrounded by the top and bottom lips 7A, 7B, and the front and rear lips 8A, 8B. The side board 6A on a left side is formed to have the same shape and size as the side board 6B on the right side; and the side boards 6A, 6B are disposed facing substantially parallel with each other.

As shown in FIG. 2, each of the side boards 6A, 6B has four cut-out portions 10 which are provided in the right-angle corners between the flat portion 9 and the front and rear lips 8A, 8B. The side boards 6A, 6B are connected to the top board 1A and the bottom board 1B by plural connecting means, such as connecting bolts 11, first securing parts 12 made of resin, second securing parts 13 made of resin and the locating members 4.

FIG. 2 shows the exploded frame unit in a provisionally assembled state. As shown in FIG. 2, the top board 2A and the bottom board 2B are provisionally connected to the side boards 6A, 6B by eight pieces of the first securing parts 12 at a front side and a rear side of the frame unit 14.

Next, assembling the top and bottom boards 1A, 1B and the side boards 6A, 6B by using the first securing parts 12 is described further referring to FIGS. 3 to 6.

Figure 3:
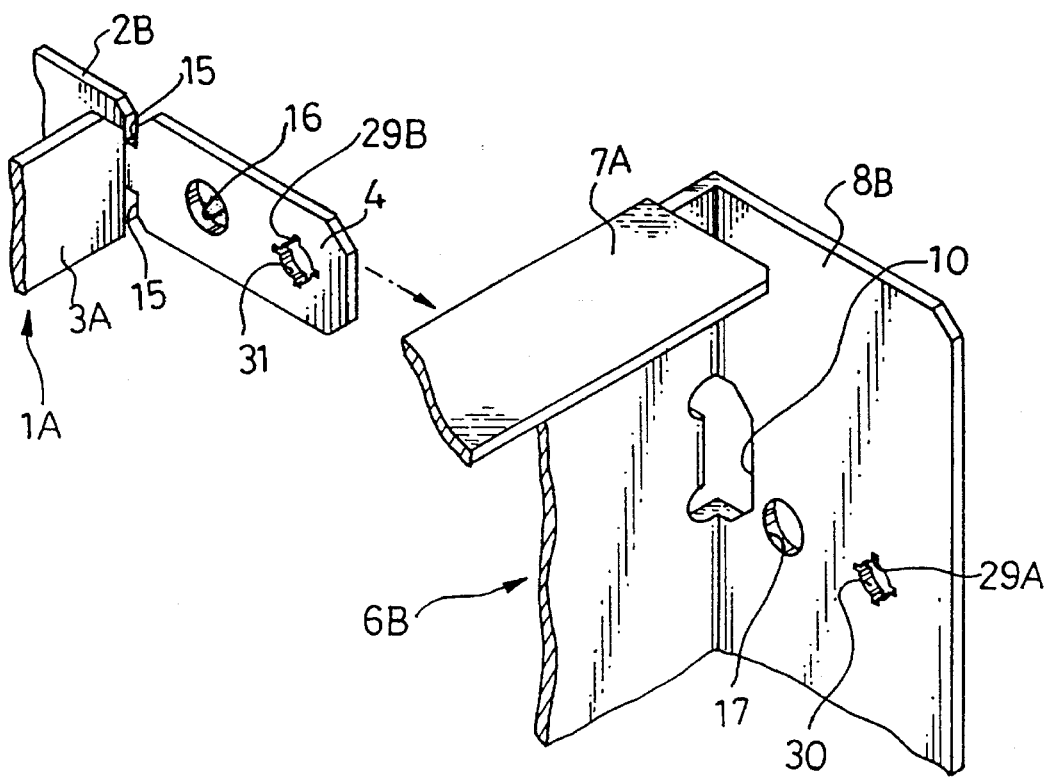
FIG. 3 is a partial perspective view showing a part of connecting portions of the frame unit of FIG. 1.

FIG. 3 shows a cutaway view of a part of the connecting portions of the top board 1A and the side board 6B. Since the top board 1A is constructed to be the same form as the bottom board 1B, the connecting means for the top board 1A only is described as a representative, and that for the bottom board 1B is omitted for simplicity in the following descriptions.

As shown in FIG. 3, the locating member 4 has two cut edge portions 15 which are formed at an upper side and a lower side of the locating member 4. The locating member 4 has a first connecting hole 16 which is formed to have a circular shape. The rear lip 8B of the side board 6B has a first securing hole 17 which has the same shape and sizes as the first connecting hole 16.

Figure 4:
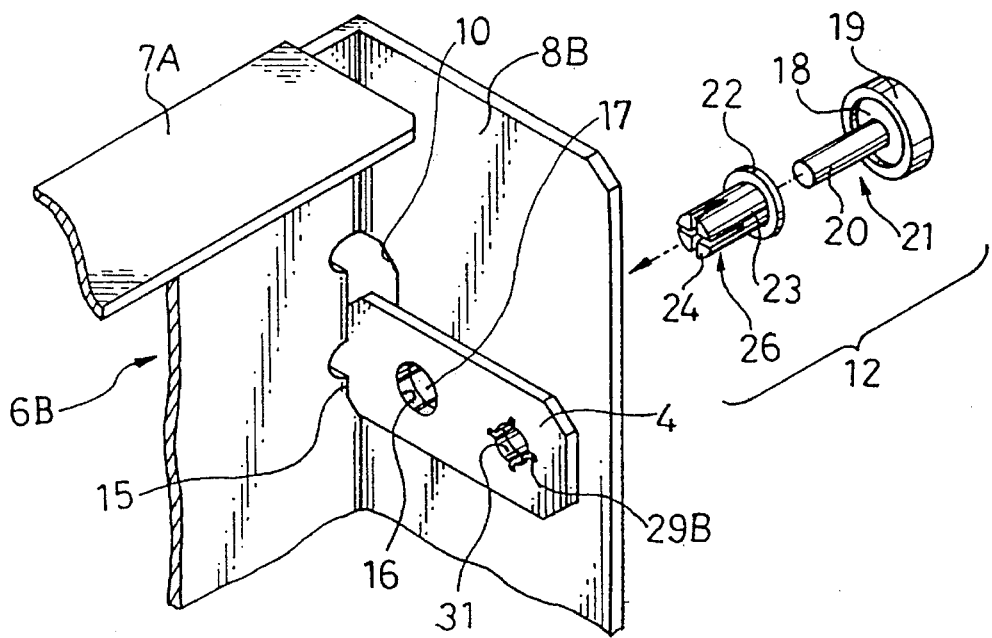
FIG. 4 is a partial perspective view showing a part of the engaged connecting portions of the frame unit of FIG. 1.
Figure 5:
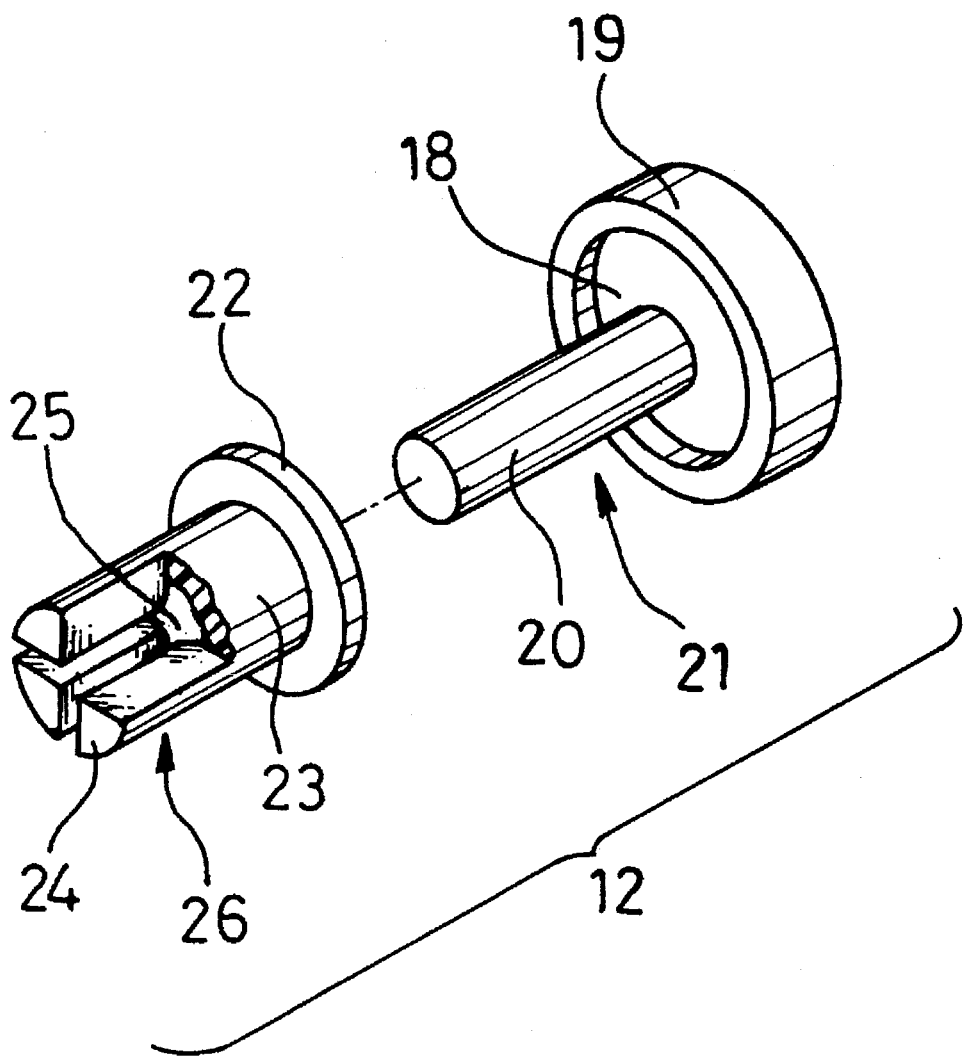
FIG. 5 is an enlarged perspective view a first securing part for assembling the frame unit of FIG. 1.

FIG. 4 shows the connecting part where the locating member 4 is fitted on the rear lip 8B of the side board 6B. As shown in FIG. 4, the cut-out portion 10 of the side board 6B receives the locating member 4, and the cutting edge portion 15 formed at a lower side of the locating member 4 is engaged with an edge of the cut-out portion 10. When the first connecting hole 16 fits to the first securing hole 17 (FIG. 3), the first connecting hole 16 and the first securing hole 17 receive the first securing part 12. FIG. 5 shows a perspective view of the first securing part 12. As shown in FIG. 5, the first securing part 12 comprises a first convex member 21 and a first concave member 26. The first convex member 21 has a nob 19 having a circular concave portion 18 and a cylinder portion 20 disposed at the center of the circular concave portion 18. The first concave member 26 has a circular convex portion 22 to be fitted to the circular concave portion 18, a cylindrical portion 23 having a circular hollow portion 25 to receive the cylinder portion 20, and cross slits portion 24.

Figure 6:
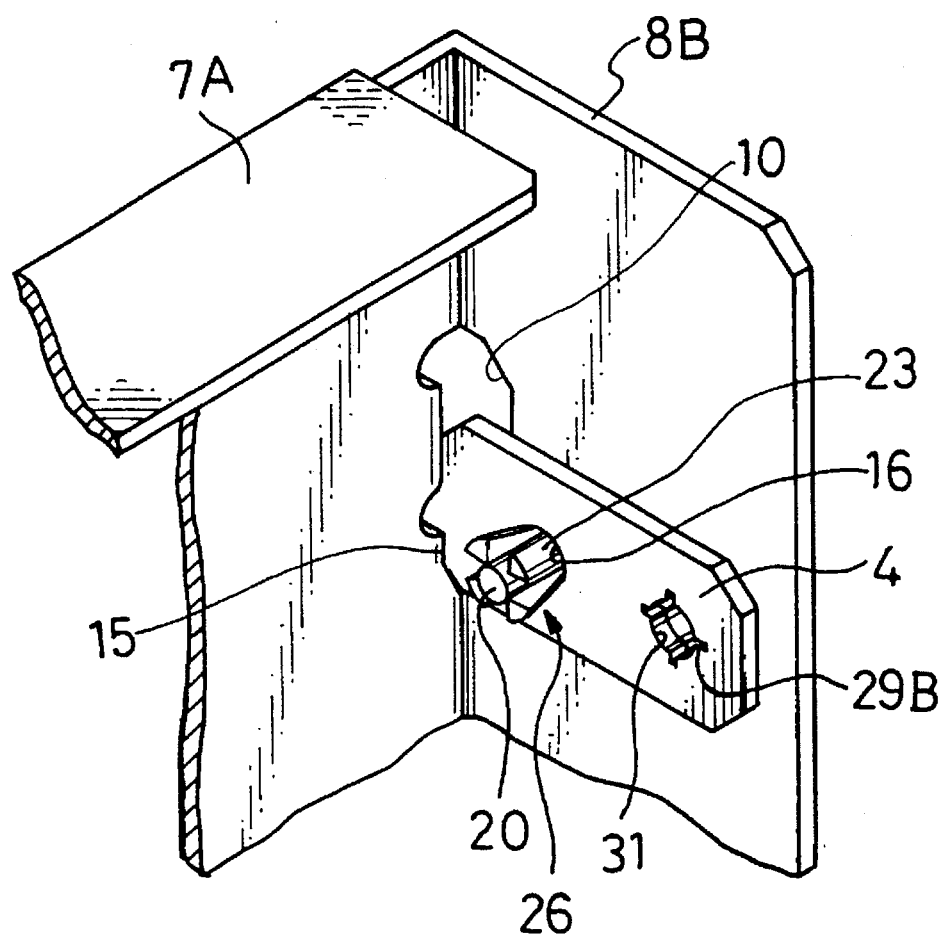
FIG. 6 is a partial perspective view showing a part of the provisionally connected connecting portions of the frame unit of FIG. 1.

FIG. 6 shows the connecting part which are provisionally connected by the first securing parts 12. In a provisional connecting step, the first concave member 26 is pushed into the first connecting hole 16 through the first securing hole 17 to make the circular convex portion 22 and the rear lip 8B touch each other, and the first convex member 21 is pushed into the first concave member 26 to make the nob 19 and the rear lip 8B touch each other. At the same time, the circular convex portion 22 of the first concave member 26 is fitted to the circular concave portion 18 of the convex member 21, and the cross slits portion 24 is expanded by the insertion of the cylinder portion 20 of the first convex member 21. As a result, the first securing parts 12 are fastened to the locating member 4 and the rear lip 8B, thereby provisionally connecting the top board 1A to the side board 6B.

In a first step of the above-mentioned connecting steps, the bottom board 1B is connected provisionally to the side boards 6A, 6B. Either of four locating members 4 of the bottom boards 1B can be connected to the side boards 6A, 6B.

Next, the top board 1A is connected provisionally to the side boards 6A and 6B. In this connecting step, either of the locating members 4 of the top board 1A can be connected to the side boards 6A, 6B. Since the cylindrical portion 23 supported by the first connecting hole 16 and the first securing hole 17 has a circular shape in section, the bottom board 1B is rotatably connected with the side boards 6A, 6B so as to allow slight rotations around the first securing part 12. Therefore, in the connecting step for the top board 1A, the locating members 4 of the top board 1A can be easily arranged through the cut-out portions 10 of the side boards 6A, 6B. And the top board 1A can be easily and speedily connected to the side boards 6A, 6B after provisionally connecting the bottom board 1B to the side boards 6A, 6B.

Figure 7:
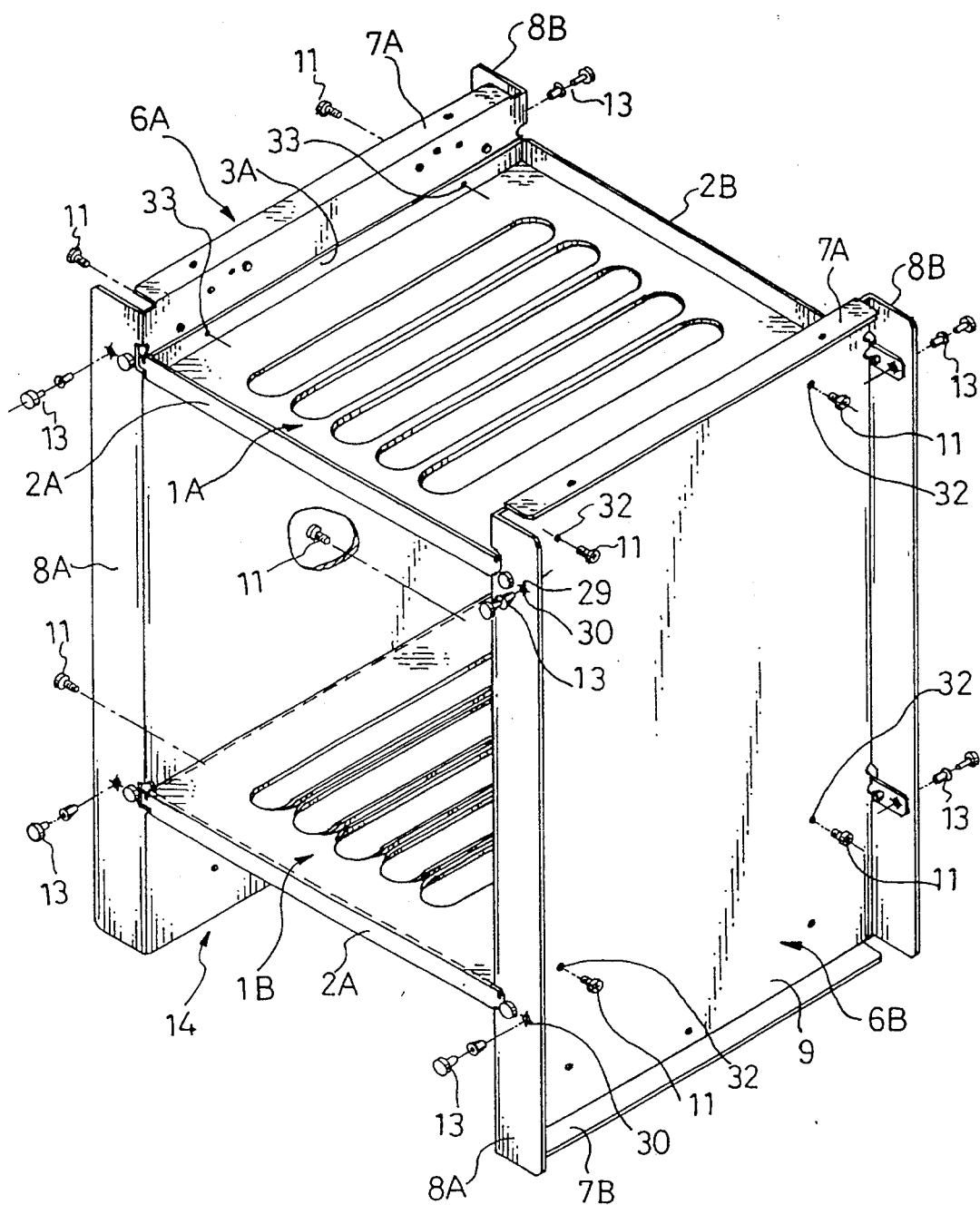
FIG. 7 is a perspective view showing a stage during the assembly of the frame unit of FIG. 1.

FIG. 7 shows a perspective view of the frame unit 14 which is provisionally connected by using the first securing parts 12. The frame unit 14 connected only by the first securing parts 12 is unstably assembled; and the side boards 6A, 6B and the top and bottom boards 1A, 1B are constructed to make a non-right angle between each other in this condition. The second securing parts 13 and the bolts 11 shown in FIG. 7 are provided for strongly assembling the frame unit 14.

Figure 8:
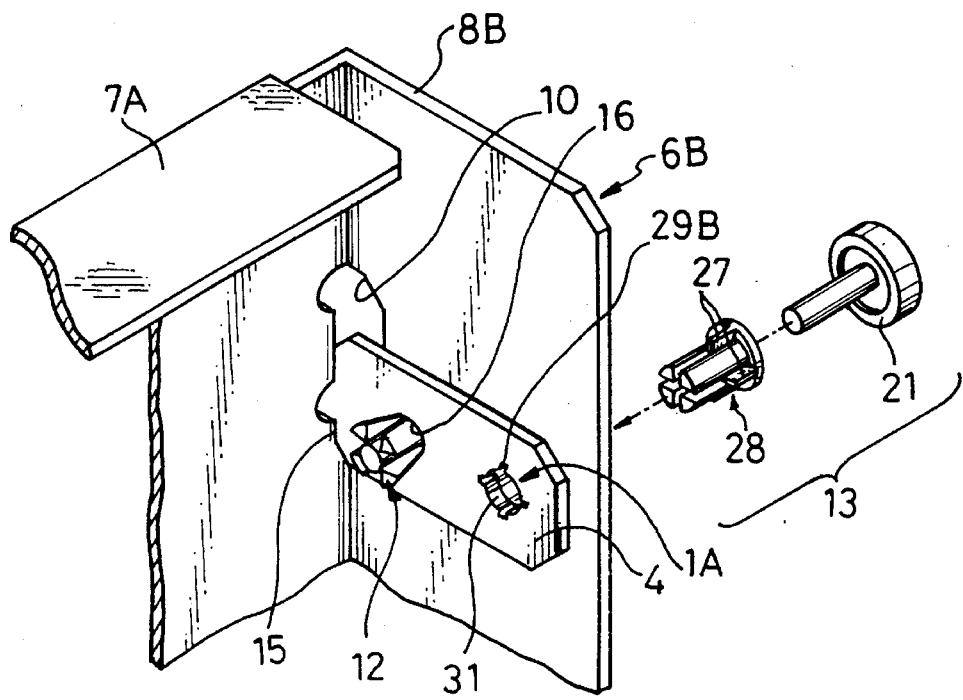
FIG. 8 is a partial perspective view showing a part of the connecting potions of the frame unit of FIG. 1.
Figure 9:
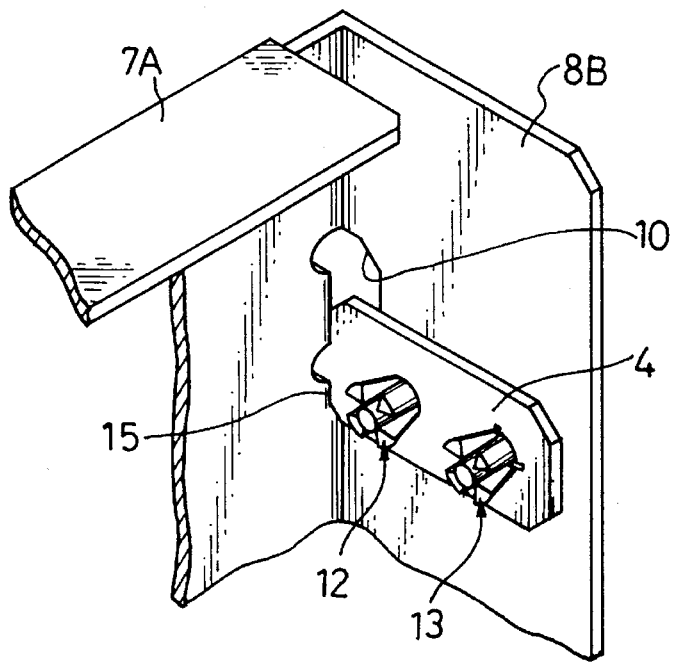
FIG. 9 is a partial perspective view showing a part of the fixed connecting portions of the frame unit of FIG. 1.

Next, assembling the frame unit using the second securing parts 13 and bolts 11 is described further referring to FIGS. 8 to 9.

FIG. 8 shows a cutaway view showing of a part of the connecting portion between the locating member 4 of the top board 1A and the rear lip 8B.

In FIG. 8, the second securing parts 13 are constructed in the substantially same manner as the first securing parts 12. As shown in FIG. 8, however, the second securing parts 13 have four locating projections 27 which are formed in a cross shape on a second concave member 28. The second securing parts 13 comprises the second concave member 28 and the first convex member 21 which is used in the first securing parts 12.

The locating member 4 has a second connecting hole 31 aligned with the first connecting hole 16 as shown in FIG. 8. The rear lip 8B of the side board 6B has a second securing hole 30 aligned with the first securing hole 17 as shown in FIG. 3. The second securing hole 30 and the second connecting hole 31 have cross cut-out portions 29A, 29B to fit with the locating projections 27 of the second securing parts 13.

As mentioned above, the second securing parts 13, which comprises the first convex member 21 and which serves as the first securing part 12 and also as the second concave member 28 having locating projections 27, are pushed into the second connecting hole 31 through the second securing hole 30 of the rear lip 8B. In the inserting step of the second securing parts 13, the first convex member 21 is pushed into the second concave member 28 after the second securing hole 30 and the second connecting hole 31 receive the second concave member 28. When the second concave member 28 is pushed into the second securing hole 30, the locating projections 27 of the second concave member 28 fit into the cross cutoff out portions 29A, 29B of the second securing hole 30 and the second connecting hole 31.

In the above-mentioned inserting step of the second securing parts 13, either of the second securing holes 30 of the front and rear lips 8A, 8B can receive the second securing parts 13. The top and bottom boards 1A, 1B and the side boards 6A, 6B can be arranged to be at right angle by fitting the cross cut-out portions 29B of the second connecting hole 31 to the cross cut-out portions 29A of the second securing hole 30.

Next, the side boards 6A, 6B are fixed to the side lips 3 of the top and bottom boards 1A, 1B by the bolts 11 which are screwed into the hole 33 of the side lips 3 through the holes 32 of the flat portions 9 in the side boards 6A, 6B.

Figure 10:
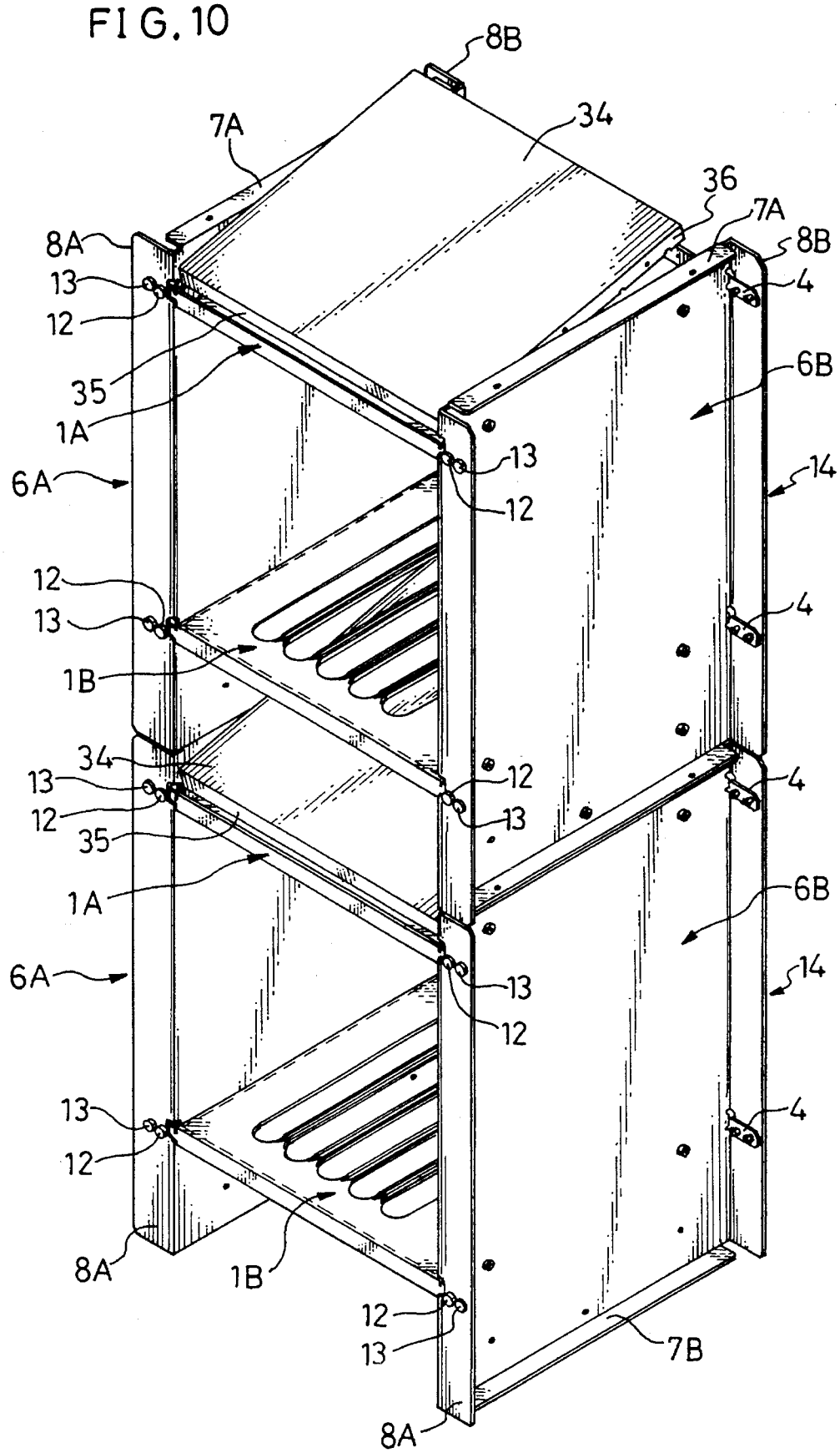
FIG. 10 is a perspective view showing two frame units connected in accordance with the present invention.
Figure 11:
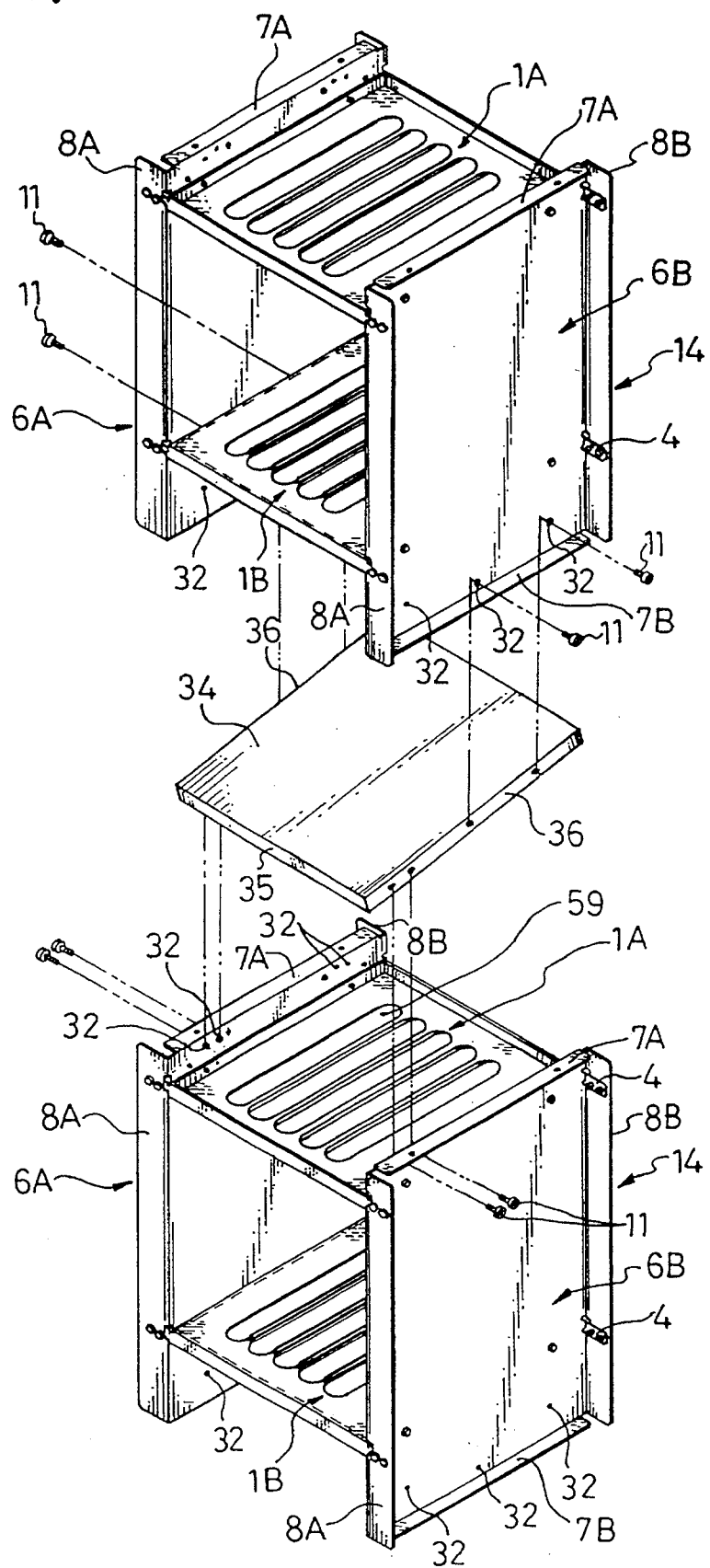
FIG. 11 is an exploded perspective view showing the connection of the frame units of FIG. 10.
Figure 12:
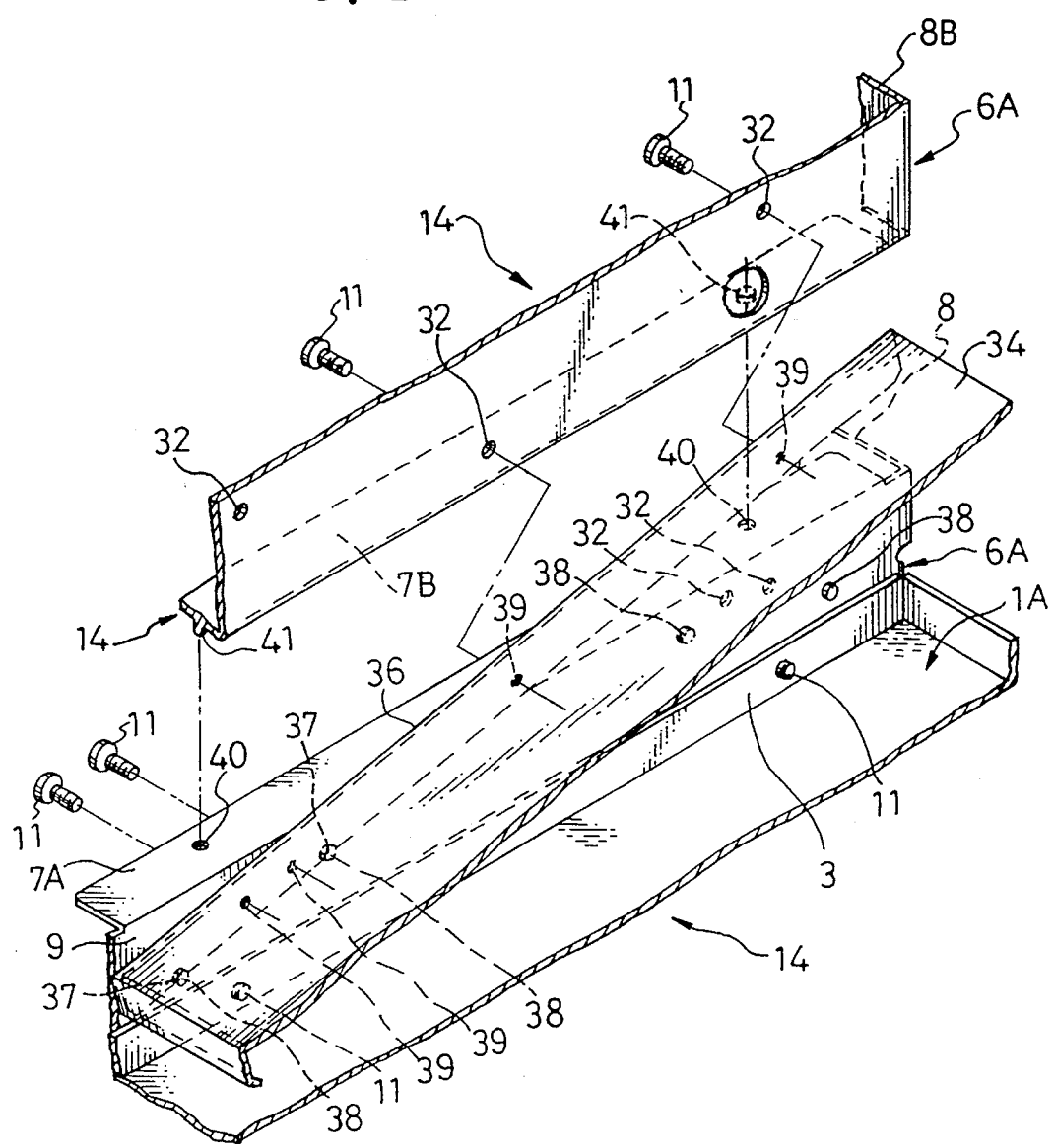
FIG. 12 is a partial perspective view showing a part of a air guide board etc. in the frame units of FIG. 10.
Figure 13:
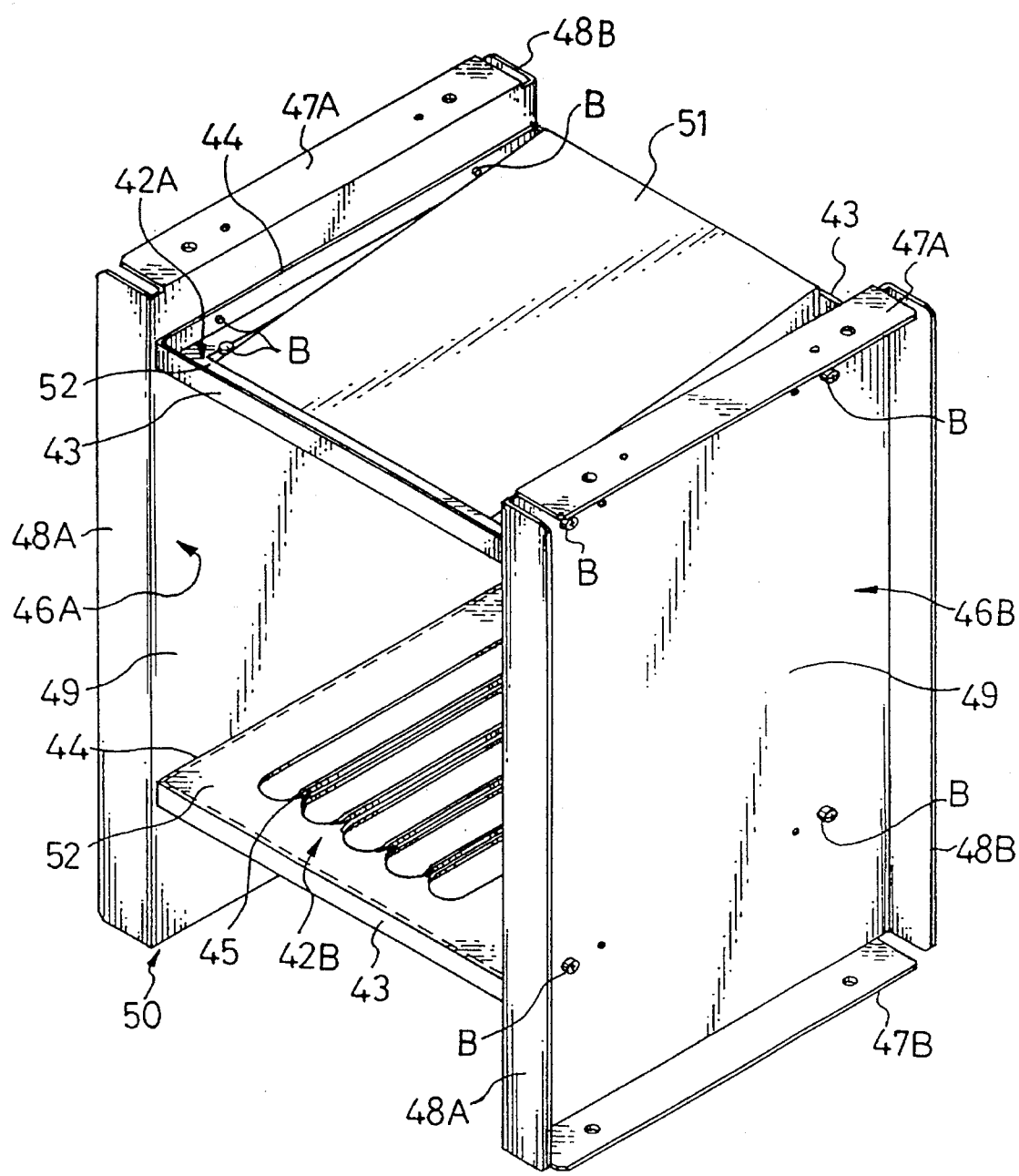
FIG. 13 is a perspective view of a conventional frame unit.
Figure 14:
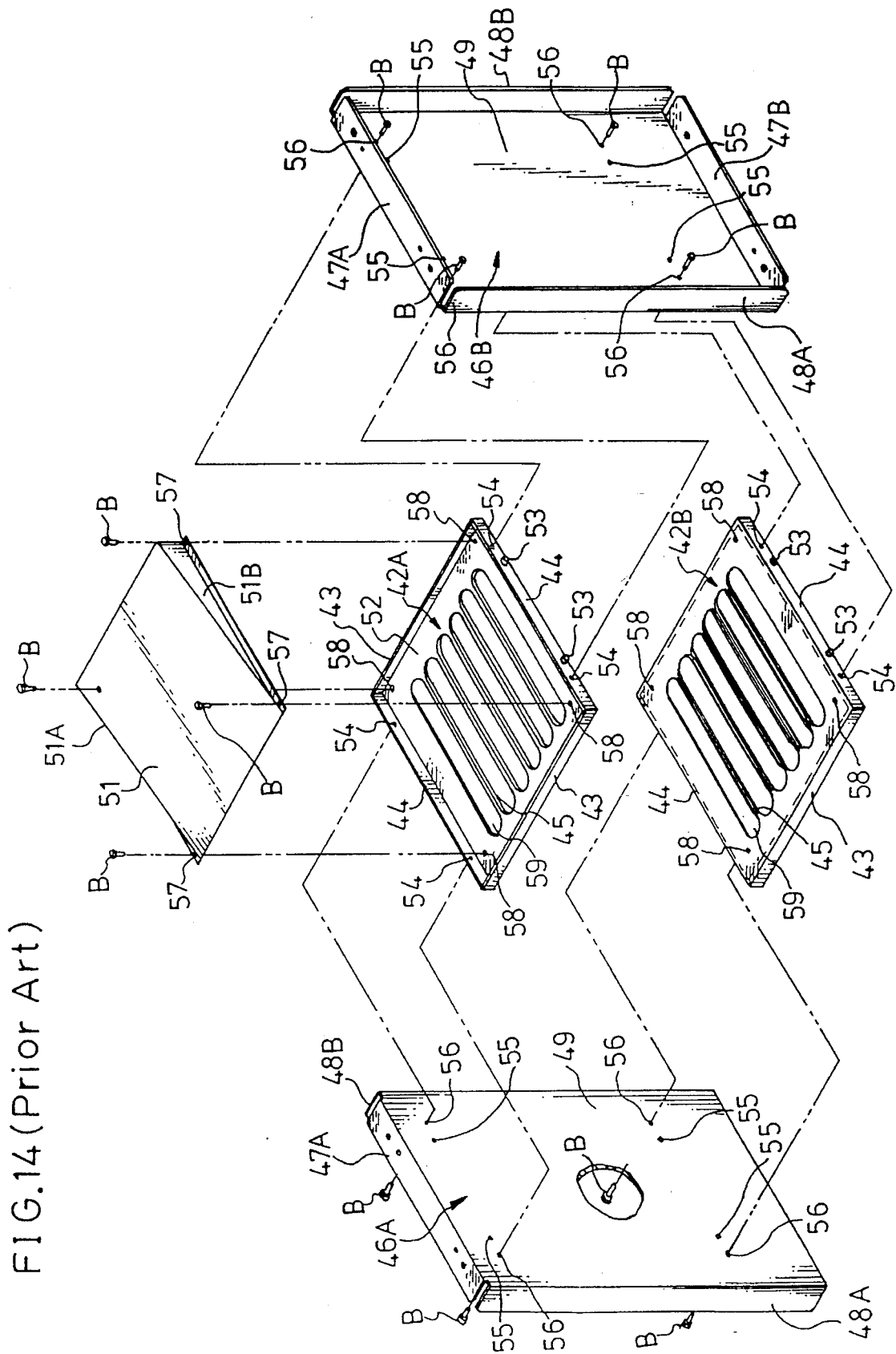
FIG. 14 is an exploded perspective view showing the conventional frame unit of FIG. 13.
Figure 15:
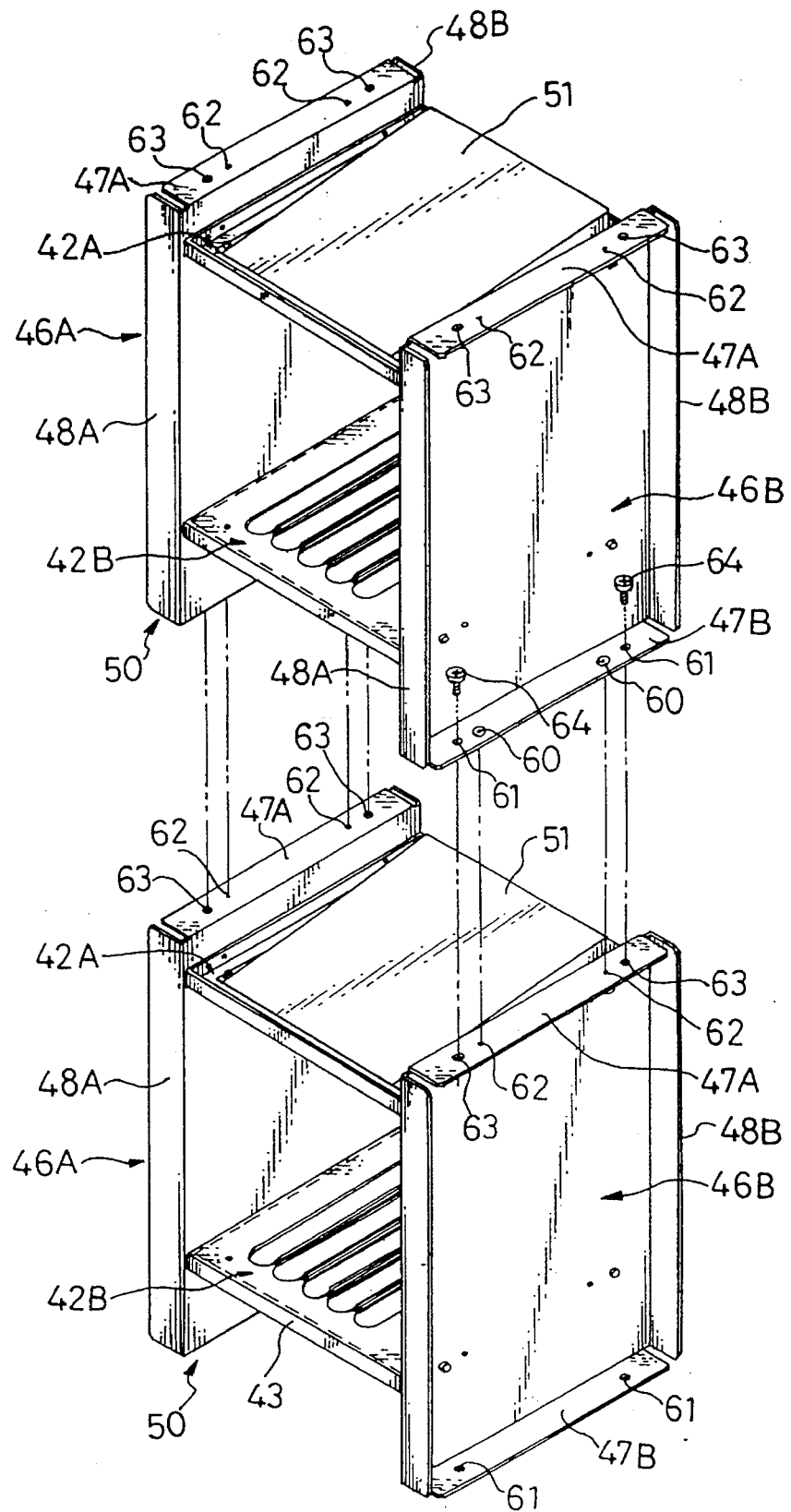
FIG. 15 is a perspective view showing the connection of two conventional frame units in the way of connecting steps.
Figure 16:
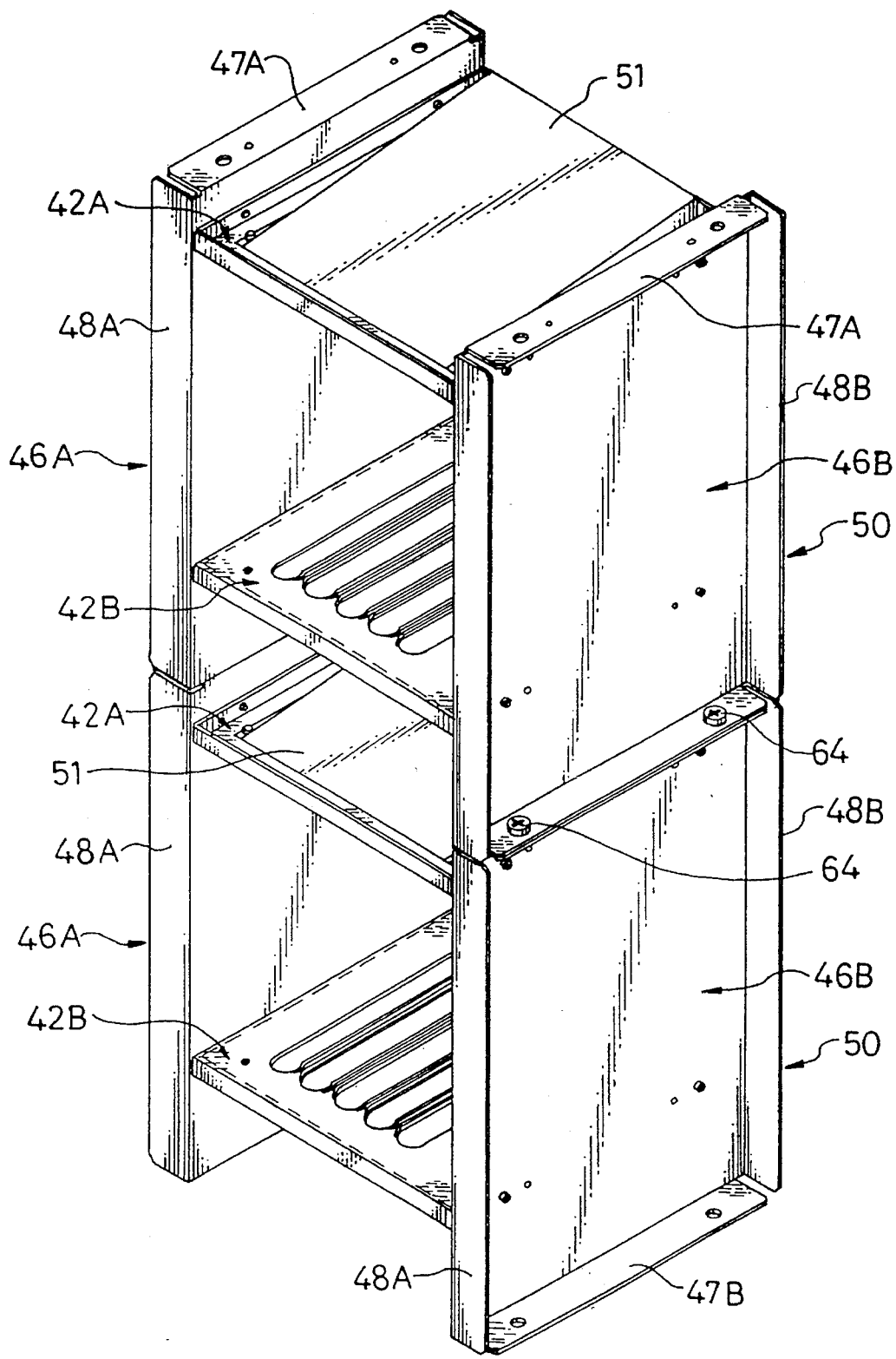
FIG. 16 is a perspective view showing the connected conventional frame units of FIG. 15.
Figure 17:
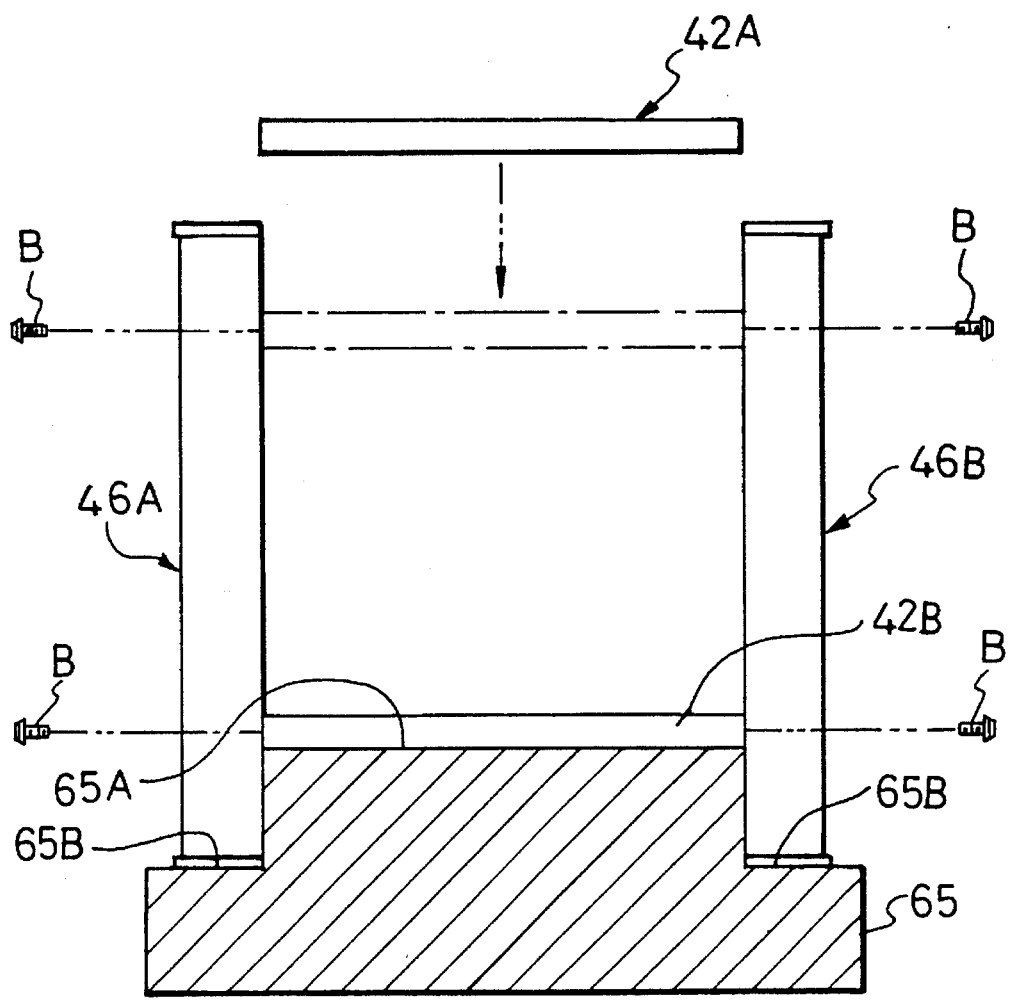
FIG. 17 is a sectional view showing the bed for assembling the conventional frame unit of FIG. 13.

Next, connecting two of the frame units 14 vertically to each other is described further referring to FIGS. 10 to 12.

FIG. 10 shows a perspective view of the connected frame units 14. FIG. 11 shows an exploded perspective view of the frame units 14 to be connected vertically to each other. FIG. 12 shows a cutaway view of the connecting portions of the frame units 14.

In FIG. 11, an air guide board 34, which has a front lip 35 and side lips 36, is arranged between two frame units 14.

The front lip 35, which is formed by bending the front side of the air guide board 34, is provided to improve the strength of the air guide board 34. The air guide board 34 does not have a bent portion at the rear thereof so that the hot air flows smoothly through the air holes 59 to the rear side. The air guide board 34 is fixed by eight bolts 11 at both sides of the frame units 14 as shown in FIG. 11.

FIG. 12 shows an enlarged cutaway view of the connecting portions where both frame units 14 are connected vertically to each other by the side lips 36 of the air guide board 34.

As shown in FIG. 12, the front side of the side lip 36 of the air guide board 34 is fixed to the top portion of lower frame unit 14, by screwing the bolts 11. The rear side of the side lip 36 of the air guide board 34 is fixed to the bottom portion of the upper frame unit 14 by screwing bolts 11.

In a first step of connecting the frame units 14 the slanted air guide board 34 is arranged between a pair of the side boards 6A and 6B of the lower frame unit 14, which was assembled already. In the first step, semi-circular cut-out portions 37, which are formed on bottom edges of the side lips 36 of the air guide board 34, are engaged with locating projections 38, which are provided on an inner-face of the flat portion 9 of the side board 6A. Next, the bolts 11 are screwed into the holes 39 of the side lips 36 of the air guide board 34 through the holes 32 (FIG. 11) of the side boards 6A, 6B.

In a second connecting step, the upper frame unit 14 is put on the lower frame unit 14 to contact between the inner face of the side board 6A, 6B of the upper frame unit 14 and the outer face of the side lips 36 of the air guide board 34. The top lip 7A of the side boards 6A, 6B of the lower frame unit 14 has two locating holes 40 that engage two locating projections 41, which are provided on the lower face of the bottom lip 7B of the upper frame units 14. In the second step, the upper frame unit 14 is put on the lower frame unit so as to engage the locating projections 41 to the locating holes 40, thereby the upper frame unit 14 is exactly disposed on the lower frame unit 14.

In a final connecting step bolts 11 are screwed into the holes 39 at the center portion and the rear portion of the side lip 36 of the air guide board 34 through holes 32 of the side boards 6A, 6B of the upper frame unit 14.

The connected frame units 14 are strengthened against all external force in a transverse direction because the front and rear portions of the air guide board 34 are solidly fixed by the bolts 11 to the upper frame unit 14 and the lower frame unit 14. Since the center portion of the side lip 36 of the air guide board 34 is fixed to the upper frame unit 14, the upper frame unit 14 is supported stably by the lower frame unit 14.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A frame unit comprising:

a top board and a bottom board each having a front edge, a rear edge and side edges, wherein said top and said bottom boards each includes a front lip disposed at said front edge, a rear lip disposed at said rear edge, and a locating member disposed at each end of said front lips and said rear lips, wherein each locating member includes a first connecting hole having a first shape defined therein, a second connecting hole having a second shape defined therein, and a first cutout defined in an edge of said locating member;

a pair of side boards each having a top edge portion, a bottom edge portion, a front edge portion, and a rear edge portion, said front edge portion and said rear edge portion having second cut-outs defined therein, said second cutouts being sized so to receive one of said locating members therein when said frame unit is in an assembled condition, wherein a portion of said side board defining said second cutout is disposed in said first cutout to provide a first interlocking engagement between each of said top and said bottom boards and said side boards when said frame unit is in said assembled condition, said front edge portion and said rear edge portion having a first securing hole having said first shape and a second securing hole having said second shape defined therein, said locating members, said front edge portion and said rear edge portions being arranged such that said first securing hole aligns with said first connecting hole and said second securing hole aligns with said second connecting hole when said frame unit is in said assembled condition;

a first securing device sized so as to fit within aligned first connecting hole and first securing hole when said frame unit is in said assembled condition thereby providing a second interlocking engagement between each of said top and said bottom boards and said side boards, wherein an exterior surface of said first securing device has a shape corresponding to said first shape of said first connecting hole and said first securing hole; and a second securing device sized so as to fit within aligned second connecting hole and second securing hole when said frame unit is in said assembled condition thereby providing a third interlocking engagement between each of said top and said bottom boards and said side board, wherein an exterior surface of said second securing device has a shape corresponding to said second shape of said second connecting hole and said second securing hole.

2. A frame unit in accordance with claim 1, wherein said top and said bottom boards have a plurality of substrate guide ribs defined therein for supporting an electrical device.

3. A frame unit in accordance with claim 1, wherein said first securing device comprises:

a first member comprising a first knob and a first body portion attached to said knob; and a second member comprising a second body portion and a plurality of tines, said second body portion having a first receiving portion defined therein for receiving said first body portion, said second body portion having a shape corresponding to said first shape of first connecting hole and said first securing hole, and said plurality of tines extending from said second body portion so as to be deflected outward by insertion of said first body portion into said first receiving portion, and wherein said second securing device comprises:

a third member comprising a second knob and a third body portion attached to said knob; and a fourth member comprising a fourth body portion and a plurality of tines extending therefrom, said fourth body portion having a second receiving portion defined therein for receiving said third body portion, said third body member having a shape corresponding to said second shape of second connecting hole and said second securing hole, said plurality of tines extending from said body portion so as to be deflected outward by insertion of said third body portion into said second receiving portion, and wherein said second shape of said third body portion, said second connecting hole and said second securing hole are non-circular so as to prevent rotation of said locating member relative to said side boards when said second securing member is provided in said second connecting hole and said second securing hole.

4. A frame unit in accordance with claim 3, wherein said first securing device is inserted into said first connecting hole and said first securing hole such that said tines associated with said first securing device engage at least one of said locating member and said side boards thereby providing said second interlocking engagement, and wherein said second securing device is inserted into said second connecting hole and said second securing hole such that said tines associated with said second securing device engage at least one of said locating member and said side boards thereby providing said third interlocking engagement.

5. A frame unit assembly comprising:

a plurality of frame units, wherein each frame unit in said plurality of frame units comprises:

a top board and a bottom board each having a front edge, a rear edge and side edges, wherein said top and said bottom boards each includes a front lip disposed at said front edge, a rear lip disposed at said rear edge, and a locating member disposed at each end of said front lips and said rear lips, wherein each locating member includes a first connecting hole having a first shape defined therein, a second connecting hole having a second shape defined therein, and a first cutout defined in an edge of said locating member;

a pair of side boards each having a top edge portion, a bottom edge portion, a front edge portion, and a rear edge portion, said front edge portion and said rear edge portion having a second cutouts defined therein, said second cutouts being sized so to receive said locating member therein when said frame unit is in an assembled condition, wherein a portion of said side board defining said second cutouts is disposed in said first cutout to provide a first interlocking engagement between each of said top and said bottom boards and said side boards when said frame unit is in said assembled condition, said front edge portion and said rear edge portion including a first securing hole having said first shape and a second securing hole having said second shape defined therein, said locating members, said front edge portion and said rear edge portions being arranged such that said first securing hole aligns with said first connecting hole and said second securing hole aligns with said second connecting hole when said frame unit is in said assembled condition;

a first securing device sized so as to fit within aligned first connecting hole and said first securing hole when said frame unit is in said assembled condition thereby providing a second interlocking engagement between each of said top and said bottom boards and said side boards, wherein an exterior surface of said first securing device has a shape corresponding to said first shape of said first connecting hole and said first securing hole; and a second securing device sized so as to fit within aligned second connecting hole and said second securing hole when said frame unit is in said assembled condition thereby providing a third interlocking engagement between each of said top and bottom boards and said side board, wherein an exterior surface of said second securing device has a shape corresponding to said second shape of said second connecting hole and said second securing hole.

6. A frame unit in accordance with claim 5, wherein for each frame unit, said top and bottom boards have a plurality of substrate guide ribs defined therein for supporting an electrical device.

7. A frame unit assembly in accordance with claim 5, wherein for each frame unit said first securing device comprises:

a first member comprising a first knob and a first body portion attached to said knob; and a second member comprising a second body portion and a plurality of tines, said second body portion having a first receiving portion defined therein for receiving said first body portion, said second body portion having a shape corresponding to said first shape of first connecting hole and said first securing hole, and said plurality of tines extending from said second body portion so as to be deflected outward by insertion of said first body portion into said first receiving portion, and wherein said second securing device comprises:

a third member comprising a second knob and a third body portion attached to said knob; and a fourth member comprising a fourth body portion and a plurality of tines extending therefrom, said fourth body portion having a second receiving portion defined therein for receiving said third body portion, said third body member having a shape corresponding to said second shape of second connecting hole and said second securing hole, said plurality of tines extending from said body portion so as to be deflected outward by insertion of said third body portion into said second receiving portion, and wherein said second shape of said third body portion, said second connecting hole and said second securing hole are non-circular so as to prevent rotation of said locating member relative to said side boards when said second securing member is provided in said second connecting hole and said second securing hole.

8. A frame unit in accordance with claim 7, wherein for each frame unit said first securing device is inserted into said first connecting hole and said first securing hole such that said tines associated with said first securing device engage at least one of said locating member and said side boards thereby providing said second interlocking engagement, and said second securing device is inserted into said second connecting hole and said second securing hole such that said tines associated with said second securing device engage at least one of said locating member and said side boards thereby providing said third interlocking engagement.

9. A frame unit assembly in accordance with claim 8, wherein said plurality of frame units includes a first frame unit disposed on top of a second frame unit such that said side boards of respective frame units on a same side of said first and said second frame units are located adjacent one another and are disposed in a same plane.

10. A frame unit assembly in accordance with claim 7, further comprising an air guide board disposed between said first frame unit and said second frame unit.

11. A frame unit assembly in accordance with claim 10, wherein said an air guide board is fixed to a lower one of said first frame unit and said second frame unit at a front side of said air guide board, and to an upper one of said first frame unit and said second frame unit at a rear side of said air guide board.

12. A frame unit in accordance with claim 10, wherein said air guide board is shaped and positioned so as to direct air from a device positioned on a lower frame unit away from a device positioned on an upper frame unit in said frame unit assembly.

\* \* \* \* \*